United States Patent [19]

Mittel

[11] Patent Number: 5,787,125
[45] Date of Patent: Jul. 28, 1998

[54] APPARATUS FOR DERIVING IN-PHASE AND QUADRATURE-PHASE BASEBAND SIGNALS FROM A COMMUNICATION SIGNAL

[75] Inventor: James Gregory Mittel, Lake Worth, Fla.

[73] Assignee: Motorola, Inc., Schaumburg, Ill.

[21] Appl. No.: 643,646

[22] Filed: May 6, 1996

[51] Int. Cl.$^6$ .................................................. H04L 27/22
[52] U.S. Cl. .......................... 375/329; 375/316; 375/350
[58] Field of Search ................................... 375/247, 316, 375/322, 323, 329, 332, 350; 329/304; 341/143, 155, 157, 61; 364/724.1

[56] References Cited

U.S. PATENT DOCUMENTS

| | | | |
|---|---|---|---|
| 5,023,940 | 6/1991 | Johnson | 375/350 X |
| 5,187,719 | 2/1993 | Birenheier et al. | 375/226 |
| 5,202,766 | 4/1993 | Mehrgardt et al. | 348/738 |
| 5,444,415 | 8/1995 | Dent et al. | 329/302 |
| 5,479,453 | 12/1995 | Anvari et al. | 375/348 |
| 5,490,173 | 2/1996 | Whikehard et al. | 375/316 |
| 5,504,455 | 4/1996 | Inkol | 329/304 |
| 5,548,244 | 8/1996 | Clewer | 329/318 |
| 5,548,617 | 8/1996 | Patel et al. | 375/316 |
| 5,619,536 | 4/1997 | Gourgue | 375/316 |

OTHER PUBLICATIONS

Richard Schreier and W. Martin Snelgrove, "Decimation for Bandpass Sigma–Delta Analog–to–Digital Conversion", pp. 1801–1804, Aug. 1990, University of Toronto, Toronto, Canada.

E. Dijkstra, O. Nys, C. Piquet, and M. Degrauwe, "On the Use of Modulo Arithmetic Comb Filters in Sigma Delta Modulators", pp. 457–460, Apr. 1988, Switzerland.

*Primary Examiner*—Young T. Tse
*Attorney, Agent, or Firm*—Pedro P. Hernandez

[57] ABSTRACT

In-phase (I) and quadrature-phase (Q) baseband signals (312, 314) are derived from a digitized signal (318) having a sampling rate. The digitized signal is band pass filtered (604) to produce a band passed signal (320), and the band passed signal is delayed (606) to produce a delayed band passed signal (322). The band passed signal and the delayed band passed signal are decimated (608) by a predetermined amount to produce, respectively, a decimated signal (328) and a decimated delayed signal (330). The decimated signal and the decimated delayed signal are low pass filtered (610) to produce, respectively, the I and Q baseband signals.

12 Claims, 3 Drawing Sheets

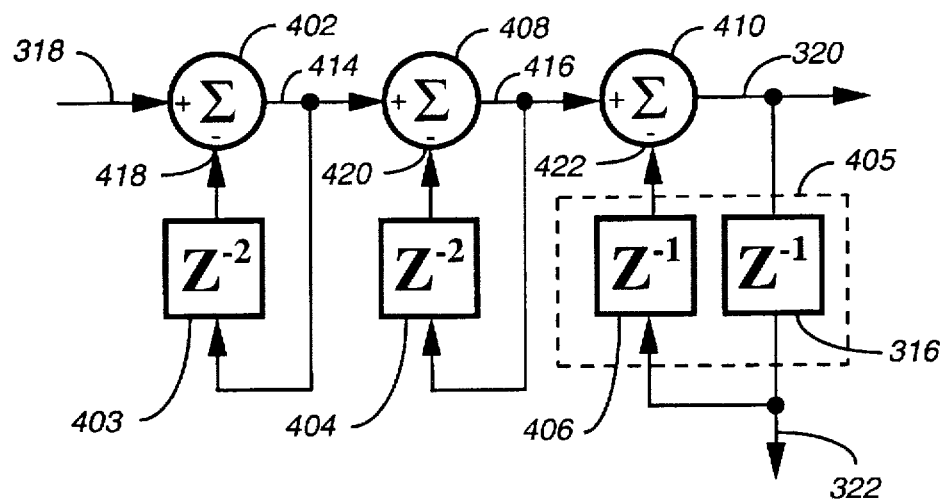
FIG. 4  306
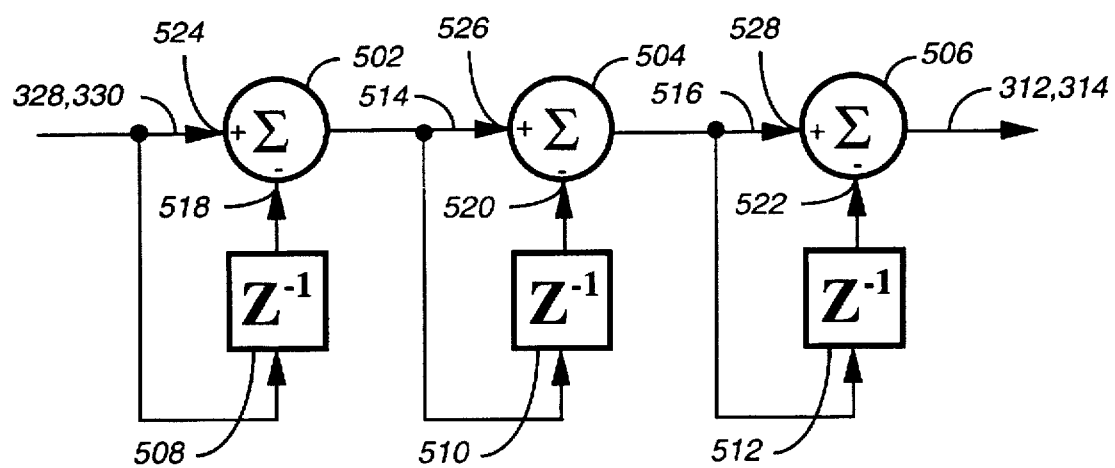
FIG. 5  308, 310

APPARATUS FOR DERIVING IN-PHASE AND QUADRATURE-PHASE BASEBAND SIGNALS FROM A COMMUNICATION SIGNAL

RELATED APPLICATION

Application Ser. No. 08/456,985, filed May 31, 1995, by Jaffee, entitled "Wide Band Zero IF Quadrature Demodulator Using a Intermediate Frequency and a Single Local Oscillator".

FIELD OF THE INVENTION

This invention relates in general to communication receivers, and more specifically to a method and apparatus for deriving in-phase and quadrature-phase baseband signals from a communication signal.

BACKGROUND OF THE INVENTION

With the advent of high performance, low cost complimentary metal oxide semiconductor (CMOS) digital logic circuits, many traditionally analog radio receiver functions have begun to be performed digitally. Many successful designs have incorporated, for example, analog-to-digital converters of the sigma-delta architecture. This architecture has required a minimum amount of analog circuitry.

Analog-to-digital converters of the sigma-delta architecture typically provide a coarse quantization analog-to-digital conversion of an input signal. Such converters typically incorporate a low pass or band pass filter to reduce the quantization noise in the frequency band of the desired input signal. To further reduce quantization noise, the clock rate used for the conversion is typically many times the Nyquist rate which would be required for sampling using a larger sample word width. Thus, the high speed, low bit width output of the sigma-delta converter must be further processed to be used by traditional radio blocks such as intermediate frequency (IF) filters and demodulators. The further processing includes filtering and decimation of the data rate. Decimation lowers the data rate of the converted signal while increasing the word width to maintain resolution. Since the quantization noise is moved out of the desired signal band by the filter in the sigma-delta converter, additional filtering is required to remove the noise to prevent the noise from being aliased into the desired signal band as the signal data rate is reduced.

In prior art receivers which have needed to derive both in-phase (I) and quadrature-phase (Q) baseband signals for demodulating a received signal, the sigma-delta converted signal has been split into separate I and Q signal paths, which are then each filtered by a high speed low pass filter, followed by a decimator, and then a low speed low pass filter. The requirement for two high speed low pass filters has adversely affected power consumption, because of the relatively high power requirements of the high speed adders therein.

Thus what is needed is an improved approach to deriving the I and Q baseband signals from a digitized signal. In particular, an approach that reduces power consumption is needed. An approach that requires only a single high speed filter would be highly desirable.

SUMMARY OF THE INVENTION

An aspect of the present invention is a method of deriving in-phase (I) and quadrature-phase (Q) baseband signals from a digitized signal having a sampling rate. The method comprises the steps of band pass filtering the digitized signal to produce a band passed signal, and delaying the band passed signal to produce a delayed band passed signal. The method further comprises the steps of decimating the band passed signal and the delayed band passed signal by a predetermined amount to produce, respectively, a decimated signal and a decimated delayed signal; and low pass filtering the decimated signal and the decimated delayed signal to produce, respectively, the I and Q baseband signals.

A second aspect of the present invention is an apparatus for deriving in-phase (I) and quadrature-phase (Q) baseband signals from a digitized signal having a sampling rate. The apparatus comprises a band pass filter coupled to the digitized signal for band pass filtering the digitized signal to produce a band passed signal, and a delay element within the band pass filter for delaying the band passed signal to produce a delayed band passed signal. The apparatus further comprises first and second decimators coupled to the band pass filter for decimating the band passed signal and the delayed band passed signal by a predetermined amount to produce, respectively, a decimated signal and a decimated delayed signal; and first and second low pass filters coupled, respectively, to the first and second decimators for low pass filtering the decimated signal and the decimated delayed signal to produce, respectively, the I and Q baseband signals.

A third aspect of the present invention is a baseband derivation circuit for deriving in-phase (I) and quadrature-phase (Q) baseband signals from an analog signal. The baseband derivation circuit comprises a sigma-delta analog-to-digital converter coupled to the analog signal for producing a digitized signal having a sampling rate, and a band pass filter coupled to the sigma-delta analog-to-digital converter for band pass filtering the digitized signal to produce a band passed signal. The baseband derivation circuit further comprises a delay element within the band pass filter for delaying the band passed signal to produce a delayed band passed signal, and first and second decimators coupled to the band pass filter for decimating the band passed signal and the delayed band passed signal by a predetermined amount to produce, respectively, a decimated signal and a decimated delayed signal. The baseband derivation circuit also includes first and second low pass filters coupled, respectively, to the first and second decimators for low pass filtering the decimated signal and the decimated delayed signal to produce, respectively, the I and Q baseband signals.

A fourth aspect of the present invention is a communication receiver, comprising an antenna for intercepting a radio signal comprising information, and a receiver element coupled to the antenna for down-converting the radio signal to derive an analog signal and for demodulating the analog signal. The communication receiver further comprises a processing system coupled to the receiver element for processing the information, and a user interface coupled to the processing system for conveying the information to a user. The communication receiver also includes user controls coupled to the processing system for providing control of the communication receiver by the user. The receiver element comprises a baseband derivation circuit for deriving in-phase (I) and quadrature-phase (Q) baseband signals from the analog signal. The baseband derivation circuit comprises a sigma-delta analog-to-digital converter coupled to the analog signal for producing a digitized signal having a sampling rate, and a band pass filter coupled to the sigma-delta analog-to-digital converter for band pass filtering the digitized signal to produce a band passed signal. The baseband derivation circuit further comprises a delay element within the band pass filter for delaying the band passed signal to produce a delayed band passed signal, and first and second decimators coupled to the band pass filter for decimating the band passed signal and the delayed band passed signal by a predetermined amount to produce, respectively, a decimated signal and a decimated delayed signal. The baseband derivation circuit also includes first and second low pass filters coupled, respectively, to the first and second decimators for low pass filtering the decimated signal and the decimated delayed signal to produce, respectively, the I and Q baseband signals.

BRIEF DESCRIPTION OF THE DRAWINGS

FIG. 4 is a detailed electrical block diagram of a band pass filter of the baseband derivation circuit in accordance with the preferred embodiment of the present invention.

FIG. 5 is a detailed electrical block diagram of a low pass filter of the baseband derivation circuit in accordance with the preferred embodiment of the present invention.

DESCRIPTION OF THE PREFERRED EMBODIMENT

Figure 1:
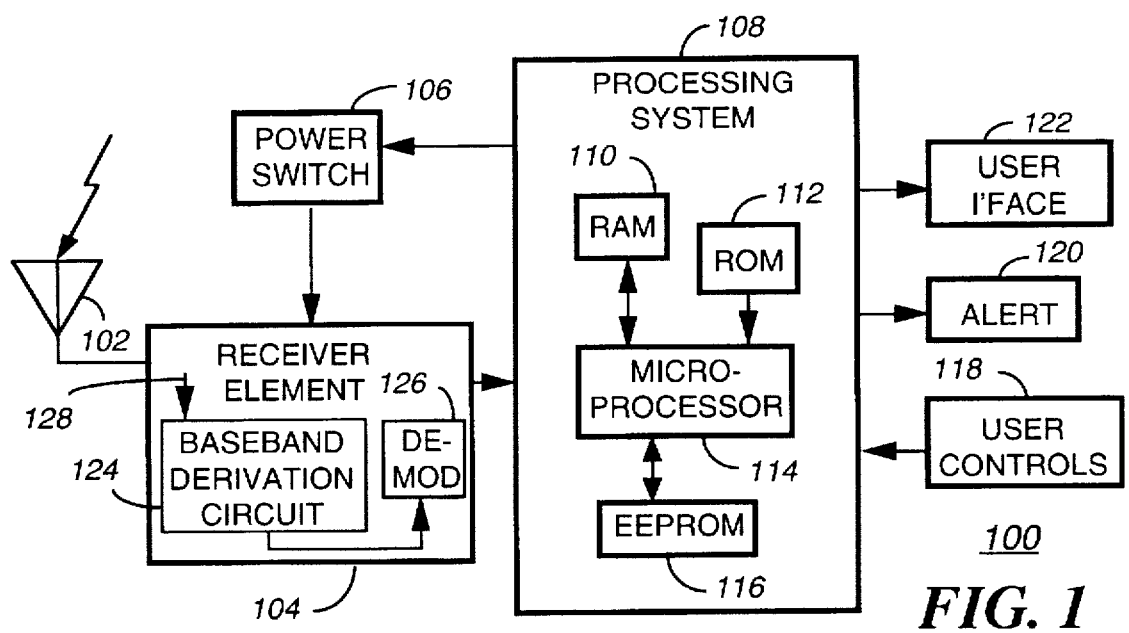
FIG. 1 is an electrical block diagram of a communication receiver in accordance with the preferred embodiment of the present invention.

FIG. 1 is an electrical block diagram of a communication receiver 100 in accordance with the preferred embodiment of the present invention. The communication receiver 100 includes an antenna 102 for intercepting a radio frequency (RF) signal comprising information from a transmitting station (not shown). The antenna 102 is coupled to a receiver element 104 for down-converting the RF signal to derive an analog intermediate frequency (IF) signal 128 using techniques well known in the art. The receiver element 104 includes a baseband derivation circuit 124 coupled to the analog IF signal 128 for deriving in-phase (I) and quadrature-phase (Q) baseband signals therefrom in accordance with the present invention, as will be described further below. The receiver element 104 also includes a conventional demodulator 126 coupled to the baseband derivation circuit 124 for demodulating the I and Q baseband signals to derive the information. The receiver element 104 is coupled to a processing system 108 for further processing of the information. A conventional power switch 106, coupled to the processing system 108, is used to control the supply of power to the receiver element 104, thereby providing a battery saving function.

To perform the necessary functions of the communication receiver 100, the processing system 108 includes a microprocessor 114, a random access memory (RAM) 110, a read-only memory (ROM) 112, and an electrically erasable programmable read-only memory (EEPROM) 116. Preferably, the microprocessor 114 is similar to the M68HC08 micro-controller manufactured by Motorola, Inc. It will be appreciated that other similar processors can be utilized for the microprocessor 114, and that additional processors of the same or alternative type can be added as required to handle the processing requirements of the processing system 108. It will also be appreciated that other types of memory, e.g., EEPROM or FLASH, can be utilized for the ROM 112, as well as the RAM 110. It will be further appreciated that the RAM 110 and the ROM 112, singly or in combination, can be manufactured as an integral portion of the microprocessor 114.

The processing system 108 is programmed by way of the ROM 112 to process incoming messages transmitted by the transmitting station. During message processing, the processing system 108 decodes in a conventional manner an address in a portion of the demodulated information, compares the decoded address with one or more addresses stored in the EEPROM 116, and when a match is detected, proceeds to process the remaining portion of the information to derive the message.

Once the processing system 108 has processed the information, it stores the message in the RAM 110, and a call alerting signal is generated to alert a user that a message has been received. The call alerting signal is directed to a conventional audible or tactile alerting device 120 for generating an audible or tactile call alerting signal.

The message can be accessed by the user through user controls 118, which provide functions such as lock, unlock, delete, read, etc. More specifically, by the use of appropriate functions provided by the user controls 118, the message is recovered from the RAM 110, and then conveyed to the user by way of a user interface 122 comprising a display for displaying an alphanumeric message. Alternatively, the user interface 122 can comprise a loudspeaker for reproducing a voice message.

Figure 2:
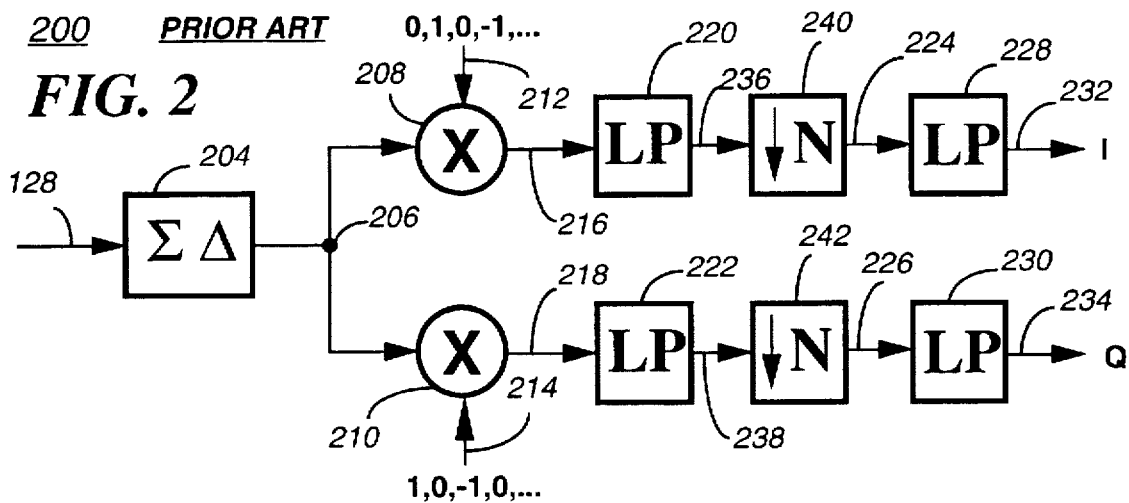
FIG. 2 is a simplified electrical block diagram of a prior art baseband derivation circuit for deriving I and Q baseband signals from a received signal.

FIG. 2 is a simplified electrical block diagram of a prior art baseband derivation circuit 200 for deriving I and Q baseband signals from a received signal. The prior art baseband derivation circuit 200 comprises a conventional sigma-delta analog-to-digital converter (ADC) 204 coupled to the IF signal 128 for producing a one-bit, high frequency digitized IF signal 206. The digitized IF signal 206 is coupled to multipliers 208, 210, for multiplication by sequences 212, 214 representing sine and cosine functions, thereby producing in-phase and quadrature-phase high frequency digitized IF signals 216, 218, respectively. The in-phase and quadrature-phase high frequency digitized IF signals 216, 218 are low pass filtered by conventional high speed low pass filters 220, 222 to remove out-of-band noise and prevent aliasing during decimation. The resultant high frequency low pass filtered signals 236, 238 are coupled to conventional decimators 240, 242 for down-sampling the high frequency low pass filtered signals 236, 238 to produce low frequency in-phase and quadrature-phase digitized signals 224, 226. The low frequency in-phase and quadrature-phase digitized signals 224, 226 are low pass filtered by conventional low pass filters 228, 230 to produce the I and Q baseband signals 232, 234. As discussed briefly in the Background of the Invention, the requirement for the two high speed low pass filters 220, 222 adversely affects power consumption in the prior art baseband derivation circuit 200, because of the relatively high power requirements of high speed adders required therein.

Figure 3:
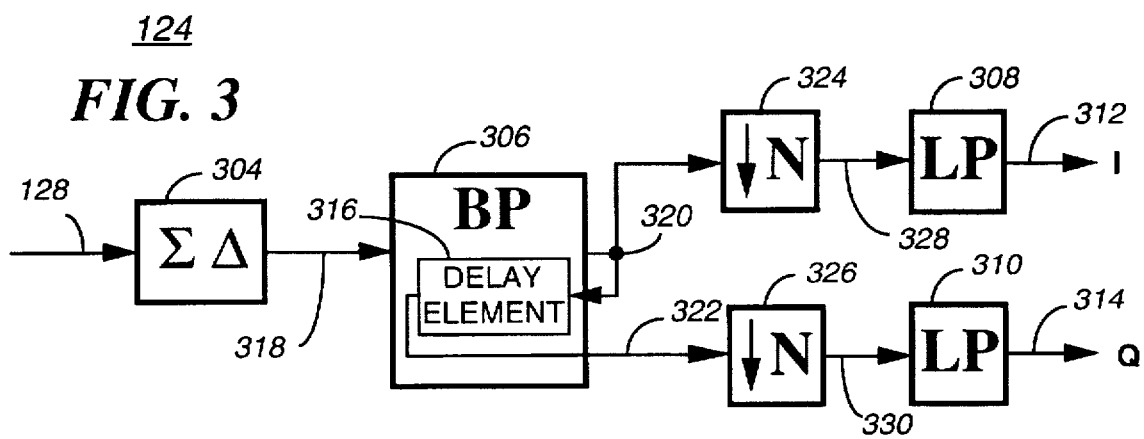
FIG. 3 is a simplified electrical block diagram of a baseband derivation circuit for deriving I and Q baseband signals from a received signal in accordance with the preferred embodiment of the present invention.

FIG. 3 is a simplified electrical block diagram of the baseband derivation circuit 124 for deriving I and Q baseband signals from a received signal in accordance with the preferred embodiment of the present invention. The baseband derivation circuit 124 comprises a conventional sigma-delta analog-to-digital converter (ADC) 304 coupled to the IF signal 128 for producing a one-bit, high frequency digitized IF signal 318. The digitized IF signal 318 is coupled to a single, novel high speed band pass filter 306 comprising a delay element 316. The high speed band pass filter 306 advantageously produces both in-phase and quadrature-phase high frequency band pass filtered signals 320, 322 in accordance with the present invention, as will be explained further below. The high speed band pass filter 306 is preferably a digital infinite impulse response (IIR) band pass filter. The high frequency band pass filtered signals 320, 322 are coupled to conventional decimators 324, 326 for down-sampling the high frequency band pass filtered signals 320, 322 to produce low frequency in-phase and quadrature-phase digitized signals 328, 330. Each of the decimators 324, 326 can be realized, for example, as a D-flip-flop based register clocked at 1/n of the sampling rate of the ADC 304, where n is a predetermined decimation factor, e.g., 64, chosen to satisfy the Nyquist rate for the data to be decoded. The low frequency in-phase and quadrature-phase digitized signals 328, 330 are then low pass filtered by conventional low pass filters 308, 310 to produce the I and Q baseband signals 312, 314. The low pass filters 308, 310 are preferably digital finite impulse response (FIR) low pass filters. Because the baseband derivation circuit 124 in accordance with the present invention requires only one high speed filter 306 and no multipliers, the power consumption is advantageously reduced compared to prior art baseband derivation circuits.

FIG. 4 is a detailed electrical block diagram of the band pass filter 306 of the baseband derivation circuit 124 in accordance with the preferred embodiment of the present invention. Before describing the band pass filter 306 in detail, some discussion of its design is in order. Research has shown that an almost ideal decimation filter structure for sigma-delta converters with low pass noise shaping filters can be achieved through the use of a sin(x)/x FIR structure of order one higher than the order of integration used in the converter filter. The transfer function of such a filter for a sigma-delta converter having a second order noise shaping low pass filter is $$\left( \sum_{i=0}^{n-1} z^{-i} \right)^3 = \left( \frac{1}{n} \times \frac{1-z^{-n}}{1-z^{-1}} \right)^3,$$

where n is the decimation factor, e.g., 64. This transfer function can be realized as an IIR portion $$\left( \frac{1}{1-z^{-1}} \right)^3$$

and a FIR portion $$(1-z^{-n})^3$$

The IIR portion operates at the high output frequency of the sigma-delta converter. By down-sampling by a factor of n between the IIR portion and the FIR portion, the n sample delay in the FIR portion can be realized as a one-sample delay. The IIR portion is essentially a three stage integrator, thus overflow of fixed point digital words can be a problem. It can be demonstrated that overflow problems can be avoided through the use of 2's complement modulo arithmetic if all registers in the filter portions are $$(K-\tfrac{1}{2}) \times \log_2(n)+W$$

bits long, where K is the order of the filter, n is the decimation factor, and W is the bit width of the sigma-delta converter output data stream. In the example case, the register bit length to prevent overflow is $$(3-\tfrac{1}{2}) \times \log_2(64)+1 = 2.5 \times 6 + 1 = 16 \text{ bits.}$$

For many radio receiver applications, the use of low pass sigma-delta converters is inappropriate. This can be due to several factors including the effects of 1/f noise. For such applications a band pass sigma-delta converter is used. A band pass sigma-delta ADC requires a corresponding band pass decimation structure. A band pass decimation structure based upon the low pass decimation structure discussed above can be determined by making the transformation $$z^{-1} \rightarrow -z^{-2},$$

which is a valid transformation from low pass to band pass if the sampling rate of the sigma-delta converter is four times the desired band pass center frequency.

In the case of a receiver in which it is desired to decimate to baseband, the IIR portion of the decimation structure is transformed to a band pass section having a transfer function $$\left( \frac{1}{1+z^{-2}} \right)^3.$$

Because the desired output is baseband, a low pass FIR portion is used, without the transformation. Because the sampling rate is four times the IIR filter center frequency, a one bit delay represents a quadrature phase shift. Thus, by introducing a one bit delay to the output of the IIR filter a quadrature output is easily achieved.

Referring again to FIG. 4, the band pass filter 306 comprises three conventional summers 402, 408, 410 coupled in tandem, each summer 402, 408, 410 having its respective output 414, 416, 320 coupled to its subtraction input 418, 420, 422, respectively, via a conventional delay element 403, 404, 405 having a two-sample delay. The input of the band pass filter 306 is coupled to the digitized IF signal 318 from the sigma-delta ADC 304. The output 320 of the summer 410 is identical to the in-phase high frequency band pass filtered signal 320 of FIG. 3. To derive the quadrature-phase high frequency band pass filtered signal 322, the two-sample delay element 405 has been divided into two tandem one-sample delay elements 406, 316 in accordance with the present invention. The one-sample delay element 316 delays the in-phase high frequency band pass filtered signal 320 by one sample, thus advantageously producing the quadrature-phase high frequency band pass filtered signal 322 without the need for multipliers and a second high speed filter, as has been required in the prior art. The quadrature-phase output is achieved because the sampling rate of the sigma-delta ADC 304 and of the band pass filter 306 is four times the center frequency of the band pass filter 306.

FIG. 5 is a detailed electrical block diagram of each of the low pass filters 308, 310 of the baseband derivation circuit 124 in accordance with the preferred embodiment of the present invention. The low pass filter 308, 310 comprises three conventional summers 502, 504, 506 coupled in tandem. A subtraction input 518, 520, 522 of each of the summers 502, 504, 506 is coupled to an addition input 524, 526, 528 of the summers 502, 504, 506, respectively, via a conventional one-sample delay element 508, 510, 512. The addition input 524 serves as the input of the low pass filter 308, 310, and is coupled to one of the low frequency in-phase and quadrature-phase digitized signals 328, 330. The output of the summer 506 provides one of the I and Q baseband signals 312, 314, the I baseband signal provided by the low pass filter 308 coupled to the in-phase high frequency band pass filtered signal 320, and the Q baseband signal provided by the low pass filter 310 coupled to the quadrature-phase high frequency band pass filtered signal 322.

Figure 6:
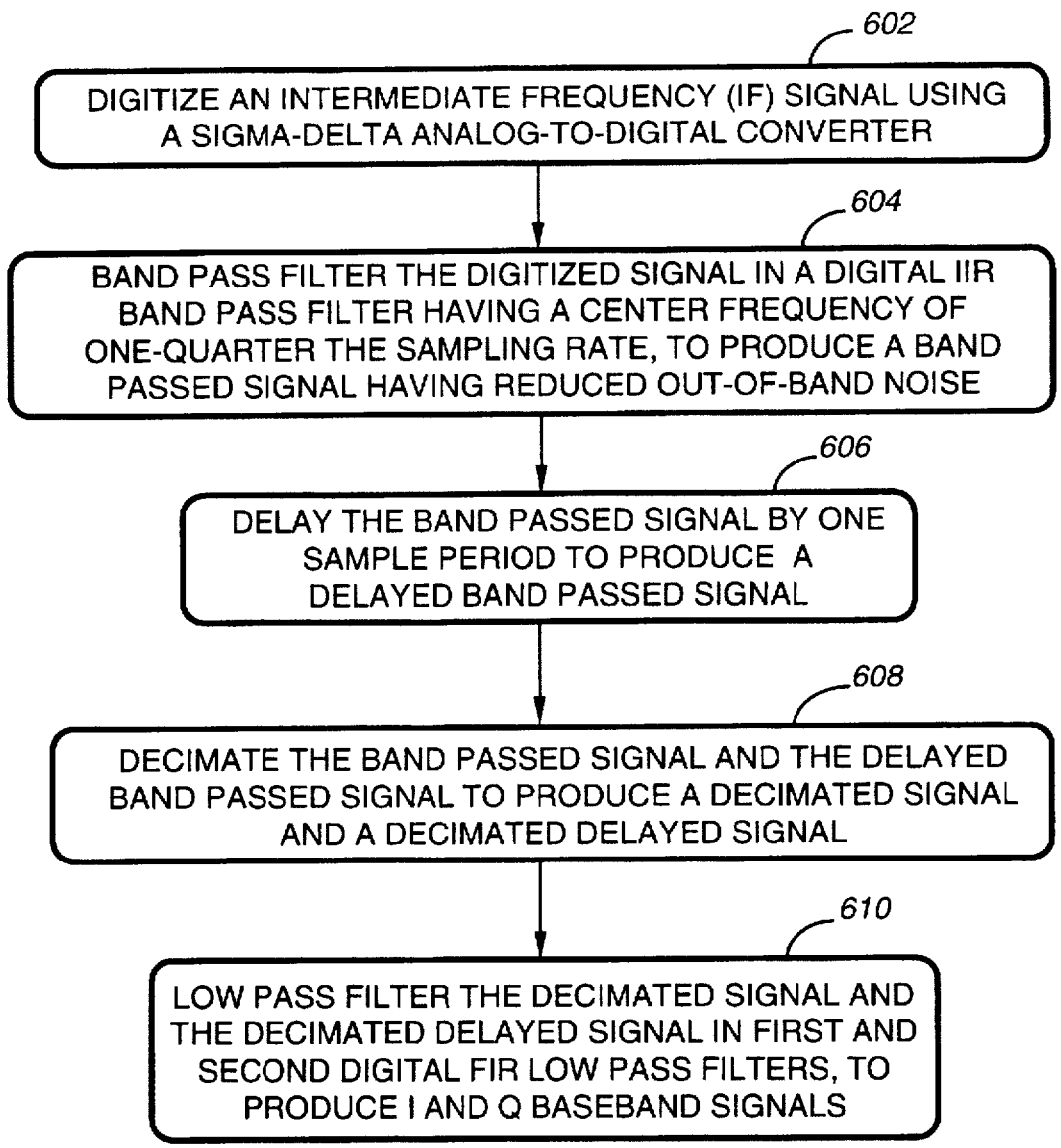
FIG. 6 is a flow chart of a method for deriving I and Q baseband signals from a received signal in accordance with the preferred embodiment of the present invention.

FIG. 6 is a flow chart 600 of a method for deriving I and Q baseband signals from a received signal in accordance with the preferred embodiment of the present invention. The flow chart 600 begins with the digitization 602 of an analog IF signal using, preferably, a conventional sigma-delta ADC. It will be appreciated that, alternatively, another type of ADC can be utilized as well to digitize the analog IF signal, and that other types of analog signals can be digitized as well for processing by the baseband derivation circuit 124. Next, the digitized signal is band pass filtered 604, preferably in a digital IIR band pass filter having a center frequency of one-quarter the sampling rate used in the ADC and in the band pass filter, to produce a band passed signal having reduced out-of-band noise. It will be appreciated that, alternatively, other types of band pass filters and other ratios of center frequency to sampling rate can be utilized as well to band pass filter the digitized signal.

In step 606 a delayed band passed signal is also produced, preferably by delaying the band passed signal by one sample period. It will be appreciated that, alternatively, other amounts of delay can be utilized, corresponding to alternative ratios of bandpass filter center frequency to sampling rate. Next, the band passed signal and the delayed band passed signal are decimated 608 (down sampled) to produce a decimated signal and a decimated delayed signal. The decimated signal and the decimated delayed signal are then low pass filtered 610, preferably in first and second digital FIR low pass filters, to produce the I and Q baseband signals. It will be appreciated that, alternatively, other types of low pass filters can be utilized as well for low pass filtering the decimated signal and the decimated delayed signal.

Thus, it should be apparent by now that the present invention provides an improved approach to deriving I and Q baseband signals from a digitized signal. The present invention advantageously provides an approach that reduces power consumption by requiring only a single high speed (i.e., high power) filter in a circuit for deriving both the I and Q baseband signals. Prior art approaches have required two high speed filters and two multipliers to achieve the same result. The present invention is especially advantageous in battery powered applications, such as portable communication receivers.

What is claimed is:

1. An apparatus for deriving in-phase (I) and quadrature-phase (Q) baseband signals from a digitized signal having a sampling rate, the apparatus comprising:

band pass filter coupled to the digitized signal for band pass filtering the digitized signal to produce a band passed signal;

delay element coupled to the band pass filter for delaying the band passed signal to produce a delayed band passed signal;

decimator means coupled to the band pass filter for decimating the band passed signal and the delayed band passed signal by a predetermined amount to produce, respectively, a decimated signal and a decimated delayed signal; and low pass filter means coupled to the decimator means for low pass filtering the decimated signal and the decimated delayed signal to produce, respectively, the I and Q baseband signals.

2. The apparatus of claim 1, wherein the low pass filter means comprises first and second digital finite impulse response (FIR) low pass filters.

3. The apparatus of claim 1, wherein the band pass filter comprises a digital infinite impulse response (IIR) band pass filter.

4. The apparatus of claim 1, wherein the band pass filter has a center frequency that is equal to one-quarter of the sampling rate and wherein the delay element comprises a one-sample delay element for delaying the band passed signal by one sample period, thereby producing a quadrature shift of the band passed signal which produces the delayed band passed signal.

5. A baseband derivation circuit for deriving in-phase (I) and quadrature-phase (Q) baseband signals from an analog signal, the baseband derivation circuit comprising:

a sigma-delta analog-to-digital converter coupled to the analog signal for producing a digitized signal having a sampling rate;

a band pass filter coupled to the sigma-delta analog-to-digital converter for band pass filtering the digitized signal to produce a band passed signal;

a delay element coupled to the band pass filter for delaying the band passed signal to produce a delayed band passed signal;

first and second decimators coupled, respectively, to the band pass filter and the delay element for decimating the band passed signal and the delayed band passed signal by a predetermined amount to produce, respectively, a decimated signal and a decimated delayed signal; and first and second low pass filters coupled, respectively, to the first and second decimators for low pass filtering the decimated signal and the decimated delayed signal to produce, respectively, the I and Q baseband signals.

6. The baseband derivation circuit of claim 5, wherein each of the first and second low pass filters comprises a digital finite impulse response (FIR) low pass filter.

7. The baseband derivation circuit of claim 5, wherein the band pass filter comprises a digital infinite impulse response (IIR) band pass filter.

8. The baseband derivation circuit of claim 5, wherein the band pass filter has a center frequency that is equal to one-quarter of the sampling rate, and wherein the delay element comprises a one-sample delay element for delaying the band passed signal by one sample period, thereby producing a quadrature shift of the band passed signal.

9. A communication receiver, comprising:

an antenna for intercepting a radio signal comprising information;

a receiver element coupled to the antenna for down-converting the radio signal to derive an analog signal and for demodulating the analog signal;

a processing system coupled to the receiver element for processing the information;

a user interface coupled to the processing system for conveying the information to a user; and user controls coupled to the processing system for providing control of the communication receiver by the user, wherein the receiver element comprises a baseband derivation circuit for deriving in-phase (I) and quadrature-phase (Q) baseband signals from the analog signal, the baseband derivation circuit comprising:

a sigma-delta analog-to-digital converter coupled to the analog signal for producing a digitized signal having a sampling rate;

a band pass filter coupled to the sigma-delta analog-to-digital converter for band pass filtering the digitized signal to produce a band passed signal;

a delay element coupled to the band pass filter for delaying the band passed signal to produce a delayed band passed signal;

first and second decimators coupled, respectively, to the band pass filter and the delay element for decimating the band passed signal and the delayed band passed signal by a predetermined amount to produce, respectively, a decimated signal and a decimated delayed signal; and first and second low pass filters coupled, respectively, to the first and second decimators for low pass filtering the decimated signal and the decimated delayed signal to produce, respectively, the I and Q baseband signals.

10. The communication receiver of claim 9, wherein each of the first and second low pass filters comprises a digital finite impulse response (FIR) low pass filter.

11. The communication receiver of claim 9, wherein the band pass filter comprises a digital infinite impulse response (IIR) band pass filter.

12. The communication receiver of claim 9, wherein the band pass filter has a center frequency that is equal to one-quarter of the sampling rate, and wherein the delay element comprises a one-sample delay element for delaying the band passed signal by one sample period, thereby producing a quadrature shift of the band passed signal.

* * * * *